(12) United States Patent
Hasegawa

(10) Patent No.: US 8,040,928 B2
(45) Date of Patent: Oct. 18, 2011

(54) SEMICONDUCTOR LASER, METHOD FOR GENERATING LASER BEAM AND METHOD FOR REDUCING A SPECTRAL LINE-WIDTH OF LASER BEAM

(75) Inventor: Hideaki Hasegawa, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 10 days.

(21) Appl. No.: 12/689,301

(22) Filed: Jan. 19, 2010

(65) Prior Publication Data

US 2010/0246613 A1 Sep. 30, 2010

(30) Foreign Application Priority Data

Mar. 27, 2009 (JP) ................. 2009-079664

(51) Int. Cl.
*H01S 3/10* (2006.01)

(52) U.S. Cl. ............... 372/20; 372/45.013; 372/50.1; 372/50.11

(58) Field of Classification Search ............ 372/20, 372/45.013, 50.1
See application file for complete search history.

(56) References Cited

U.S. PATENT DOCUMENTS

| 7,535,944 B1* | 5/2009 | Guilfoyle et al. | 372/50.11 |
| 2004/0147053 A1* | 7/2004 | Glew et al. | 438/31 |

FOREIGN PATENT DOCUMENTS

| JP | 2007-129028 | 5/2007 |
| JP | 2007-201293 | 8/2007 |
| JP | 2007-220922 | 8/2007 |

OTHER PUBLICATIONS

M. Seimetz, "Laser line-width limitations for Optical Systems with High-order Modulation employing Feed Forward Digital Carrier Phase Estimation," in Proc. Optical Fiber Communication Conference (OFC2008), San Diego, USA, paper OTuM2 (2008).
Kiyota, et al., "Laser and Optical Amplifier using Low Group Velocity Effect of Photonic Crystal Line Defect Waveguide".
M. Okai, "Corrugation-Pitch-Modulated Corrugation-Pitch-Modulated MQW-DFB Laser with Narrow Spectral line-width (170 kHz)," IEEE Photonics Technol., Lett., vol. 2, No. 8, pp. 529-530, Aug. 1990.
K. Kikuchi, "Coherent Transmission Systems," European Conference on Optical Communication (ECOC2008), Brussel Belgium, paper Th.2.A.1(2008).

* cited by examiner

*Primary Examiner* — Dung Nguyen
(74) *Attorney, Agent, or Firm* — Turocy & Watson, LLP

(57) ABSTRACT

A semiconductor laser is provided capable of generating very narrow laser beams and having stable characteristics, a method for generating the laser beams and a method for reducing a spectral line-width of the laser beams. The semiconductor laser includes a semiconductor active layer, a photonic crystal optical waveguide forming a periodic structure of two-dimensional refractive index within a plane perpendicular to a semiconductor laminate direction directly or indirectly connected to the semiconductor active layer; and an optical cavity that contains the semiconductor active layer and the photonic crystal optical waveguide and oscillates light that is generated from the semiconductor active layer and is guided through the photonic crystal optical waveguide as laser.

8 Claims, 13 Drawing Sheets

SEMICONDUCTOR LASER, METHOD FOR GENERATING LASER BEAM AND METHOD FOR REDUCING A SPECTRAL LINE-WIDTH OF LASER BEAM

CROSS-REFERENCE TO RELATED APPLICATIONS

This application claims priority from Japanese Application No. 2009-079664, filed on Mar. 27, 2009, the entire content of which is incorporated herein by reference.

FIELD OF THE INVENTION

The present invention relates to a semiconductor laser, a method for generating a laser beam and a method for reducing a spectral line-width of the laser beam.

DESCRIPTION OF THE RELATED ART

A semiconductor laser whose wavelength may be swept in a wideband and whose spectral line-width (referred to as a line-width hereinafter) is narrow is essential in DWDM (Dense Wavelength Division Multiplexing) and a coherent optical communication system of exchanging information by using phase of light. The line-width must be reduced to 100 kHz or less in using 16 QAM (Quadrature Amplitude Modulation) and 16 PSK (Phase Shift Keying), which is higher-order modulation scheme in particular in the coherent optical communication system.

Here, the line-width of laser $(\Delta f_{laser})_{FWHM}$ is known to be represented by Equation 1:

$$(\Delta f_{laser})_{FWHM} = \frac{2\pi h f^3}{PQ^2} \frac{N_2}{N_2 - N_1}(1 + \alpha^2) \quad (1)$$

In Equation 1, h is Planck's constant, f is light frequency, P is a laser output, Q is quality factor (normally referred to as a Q factor) of laser, $N_2$ is carrier density in excitation level and $N_1$ is carrier density in ground level. Further, α is an α parameter of laser and may be represented by Equation 2 in the case of the semiconductor laser:

$$\alpha = -\frac{4\pi}{\lambda} \frac{\frac{\partial n}{\partial N}}{\frac{\partial g}{\partial N}} \quad (2)$$

In Equation 2, n is refractive index of a semiconductor active layer, $N(=N_1+N_2)$ is carrier density and g is a gain coefficient.

The Q factor in Equation 1 may be represented by Equation 3, as follows:

$$Q = 2\pi f \left(\frac{2 n_g L_{opt}}{c \cdot \delta}\right) \quad (3)$$

In Equation 3, f is light frequency, $n_g$ is group refractive index of an optical cavity, $L_{opt}$ is an optical length, c is light velocity in vacuum and δ is an attenuation coefficient of the optical cavity.

As it is apparent from Equation 1 described above, the line-width of the laser beam largely depends on the Q factor of the optical cavity for oscillating the laser. However, the Q factor is small because the cavity length is often as short as 300 μm to 1000 μm in the case of the semiconductor laser in particular. In order to deal with this problem, a technology of reducing the line-width of the laser by increasing the Q factor is being studied. For instance, there is a method of lengthening the optical cavity length $L_{opt}$ by adopting a structure of an external cavity as the method of increasing the Q factor. As a gain medium, there is a fiber laser and the like that increase the Q factor by using an EDF (Er-Doped Fiber) or a SOA (Semiconductor Optical Amplifier) and by combining them with an optical cavity composed of a long optical fiber having a length of several meters or more.

PRIOR ART DOCUMENTS

Patent Documents

[Patent Document 1] Japanese Patent Application Laid-open No. 2007-129028
[Patent Document 2] Japanese Patent Application Laid-open No. 2007-201293
[Patent Document 3] Japanese Patent Application Laid-open No. 2007-220922

Non-Patent Documents

[Non-Patent Document 1] M. Seimetz, "Laser line-width limitations for Optical Systems with High-order Modulation employing Feed Forward Digital Carrier Phase Estimation," in Proc. Optical Fiber Communication Conference (OFC2008), San Diego, USA, paper OTuM2 (2008).
[Non-patent Document 2] Kiyota, et al., "Laser and Optical Amplifier using Low Group Velocity Effect of Photonic Crystal Line Defect Waveguide"
[Non-patent Document 3] M. Okai, "Corrugation-Pitch-Modulated "Corrugation-Pitch-Modulated MQW-DFB Laser with Narrow Spectral line-width (170 kHz)," IEEE Photonics Technol., Lett., Vol. 2, No. 8, pp. 529-530, August 1990.
[Non-patent Document 4] K. Kikuchi, "Coherent Transmission Systems," European Conference on Optical Communication (ECOC2008), Brussel Belgium, paper Th.2.A.1 (2008).

However, the whole laser increases in size in the case of the method of increasing the Q factor by lengthening the optical cavity length as described above. Accordingly, this method has such problems that characteristics of the laser become unstable because an effective optical cavity length is prone to change due to temperature changes and vibrations, beside that its cost increases.

In view of the problems described above, the invention seeks to provide a semiconductor laser capable of generating a laser beam with a very narrow spectral line-width and having stable characteristics, a method for generating the laser beam and a method for reducing a spectral line-width of the laser beam.

SUMMARY OF THE INVENTION

In order to solve the aforementioned problems and to attain the object of the invention, a semiconductor laser of the invention includes a semiconductor active layer, a photonic crystal optical waveguide directly or indirectly connected to the semiconductor active layer and forming a periodic structure of two-dimensional refractive index within a plane perpendicular to a semiconductor laminate direction and an optical cavity that contains the semiconductor active layer and the photonic crystal optical waveguide and oscillates light that is generated from the semiconductor active layer and is guided through the photonic crystal optical waveguide as laser.

Preferably, the semiconductor laser includes the semiconductor active layer, the photonic crystal optical waveguide directly or indirectly connected to the semiconductor active layer and forming the periodic structure of two-dimensional refractive index within the plane perpendicular to the semiconductor laminate direction, a waveguide mode converter inserted between the semiconductor active layer and the photonic crystal optical waveguide and an optical cavity that contains the semiconductor active layer, the waveguide mode converter and the photonic crystal optical waveguide and oscillates light that is generated from the semiconductor active layer and is guided through the waveguide mode converter and the photonic crystal optical waveguide as laser.

Preferably, the waveguide mode converter in the semiconductor laser of the invention has a high mesa structure formed into a shape of mesa stripe from an upper cladding layer to a depth reaching at least to a lower cladding layer while interposing a core layer.

Preferably, at least the semiconductor active layer and the photonic crystal optical waveguide are formed by monolithically integrating by using a butt joint growth method.

Preferably, the semiconductor laser further includes a wavelength selecting means formed within the optical cavity and selectively oscillating light of wavelength corresponding at least to either one of longitudinal modes of the optical cavity as laser.

Preferably, the wavelength selecting means is a distributed-feedback diffraction grating formed along the semiconductor active layer.

Preferably, the wavelength selecting means is a pair of distributed Bragg reflecting mirrors disposed so as to interpose the semiconductor active layer in the optical waveguide direction.

Preferably, the semiconductor laser further includes a mode synchronizing means having a semiconductor saturable absorber.

A method for generating a laser beam includes steps of guiding light generated from a semiconductor active layer to a photonic crystal optical waveguide and oscillating the laser beam by an optical cavity containing the semiconductor active layer and the photonic crystal optical waveguide.

A method for reducing a spectral line-width of a laser beam includes a step of inserting a photonic crystal optical waveguide into an optical cavity to reduce the spectral line-width of the laser beam to be oscillated.

The invention brings about effects of realizing the semiconductor laser capable of generating laser beams with a narrow line-width and having stable characteristics, the method for generating the laser beams and the method for reducing a spectral line-width of the laser beams.

BEST MODE FOR CARRYING OUT THE INVENTION

Figure 1:
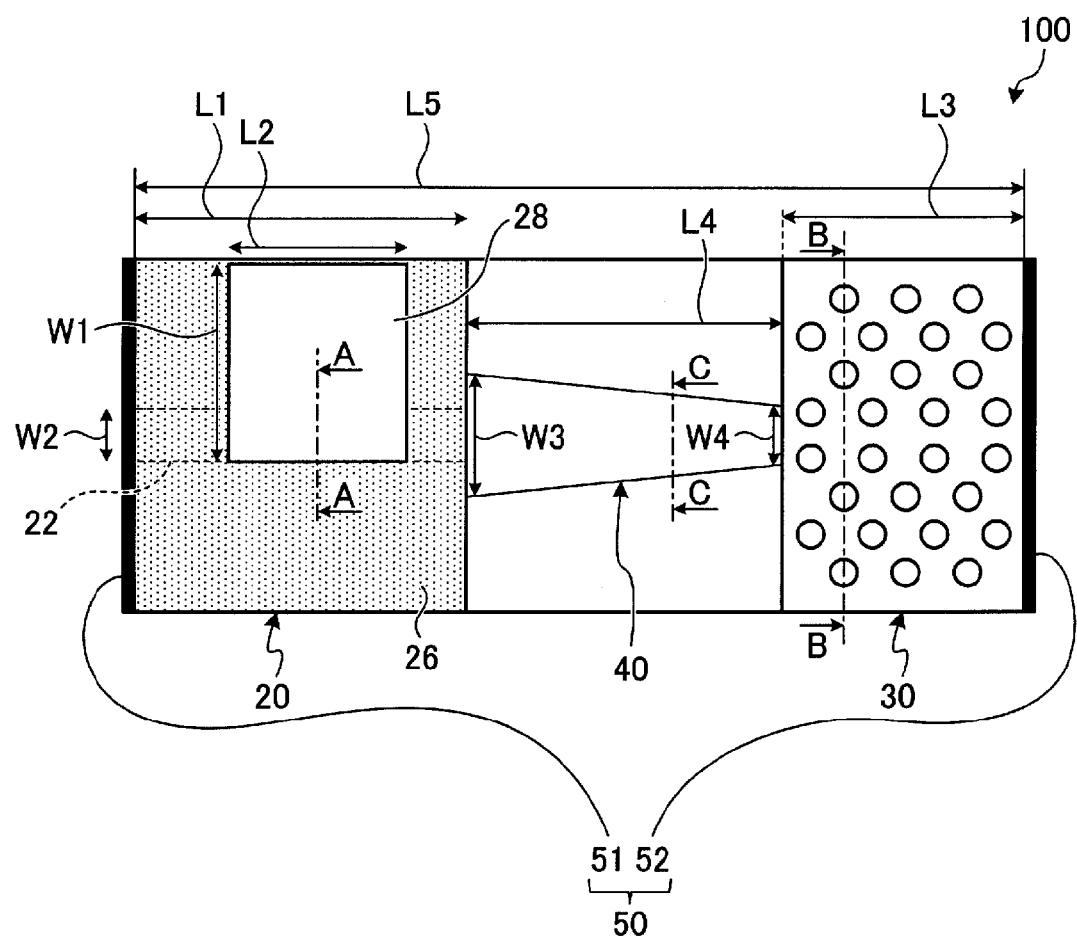
FIG. 1 is a schematic plan view of a semiconductor laser according to a first embodiment of the invention.

Preferred embodiments of a semiconductor laser, a method for generating a laser beam and a method for reducing a spectral line-width of the laser beam of the invention will be explained in detail below with reference to the drawings. Note that it should not be construed that the embodiments limit the invention. Still more, the same or corresponding components are denoted appropriately by the same reference numerals throughout the drawings.

First Embodiment

FIG. 1 is a schematic plan view of a semiconductor laser according to a first embodiment of the invention. The semiconductor laser 100 has an active section 20 containing a semiconductor active layer 22, a photonic crystal optical waveguide 30 and a mode converter 40 interposed between the active section 20 and the photonic crystal optical waveguide 30 on a substrate 10 (not shown in FIG. 1). The active section 20 is indirectly connected with the photonic crystal optical waveguide 30 through the mode converter 40. This semiconductor laser 100 also has an optical cavity 50 containing the active section 20, the photonic crystal optical waveguide 30 and the mode converter 40. The optical cavity 50 is a Fabry-Perot optical cavity having high reflection coatings 51 and 52 formed respectively at an end face of the active section 20 and an end face of the photonic crystal optical waveguide 30.

Figure 2:
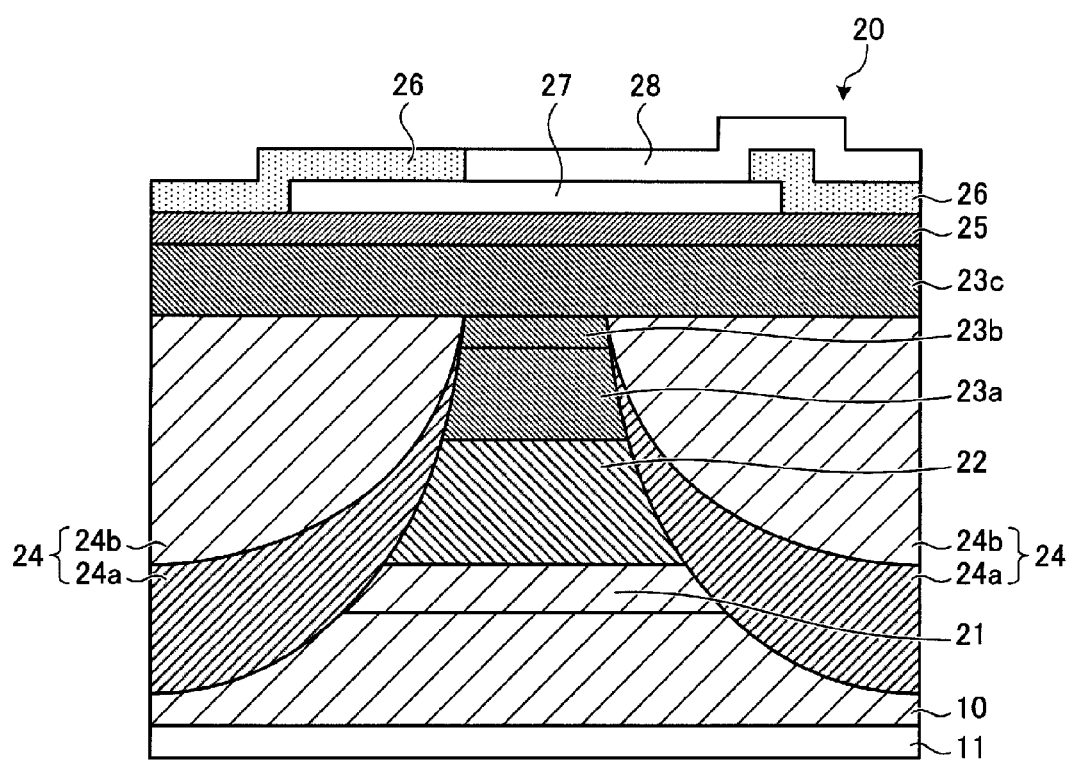
FIG. 2 is a section view of the semiconductor laser taken along a line A-A in FIG. 1.

Next, sectional structures of the active section 20, the photonic crystal optical waveguide 30 and the waveguide mode converter 40 shown in FIG. 1 will be explained sequentially. FIG. 2 is a section view of the semiconductor laser taken along a line A-A in FIG. 1. As shown in FIG. 2, the active section 20 of the semiconductor laser 100 has a structure in which a lower cladding layer 21 made of n-type InP that also plays a role of a buffer layer, a semiconductor active layer 22, upper cladding layers 23a and 23b made of p-type InP are layered on the substrate 10 made of n-type InP and having a n-side electrode 11 formed on the back thereof. The active section 20 has a mesa structure from part of the substrate 10 to the upper cladding layer 23b whose both sides are buried in current blocking layers 24 composed of an upper current blocking layer 24a made of p-type InP and an upper current blocking layer 24b made of n-type InP. Still more, an upper cladding layer 23c made of p-type InP and a contact layer 25 made of p-Type InGaAsP are layered on the upper cladding layer 23b and the current blocking layers 24. A p-side electrode 27 is also formed on the contact layer 25 and is protected by a protective layer 26. Further, an electrode pad 28 is formed at an opening formed through the protective layer 26 so as to contact with the p-side electrode 27.

The semiconductor active layer 22 is made of InGaAsP and has a MQW-SCH active layer in which three stages of SCH (Separate Confinement Hetero-structure) is formed on both sides of a MQW (Multi-Quantum Well) structure. It is noted that the MQW structure is a six-layered structure whose well layer is 6 nm thick and whose barrier layer is 10 nm thick. A width of the semiconductor active layer 22 is 1.8 μm and a mode field diameter of the waveguide is about 1.6 μm. A gain length of the semiconductor active layer 22 is 400 μm that is equal to a length L of the active section 20. The electrode pad 28 has a length L2 of 200 μm and a width W1 of 200 μm.

Figure 3:
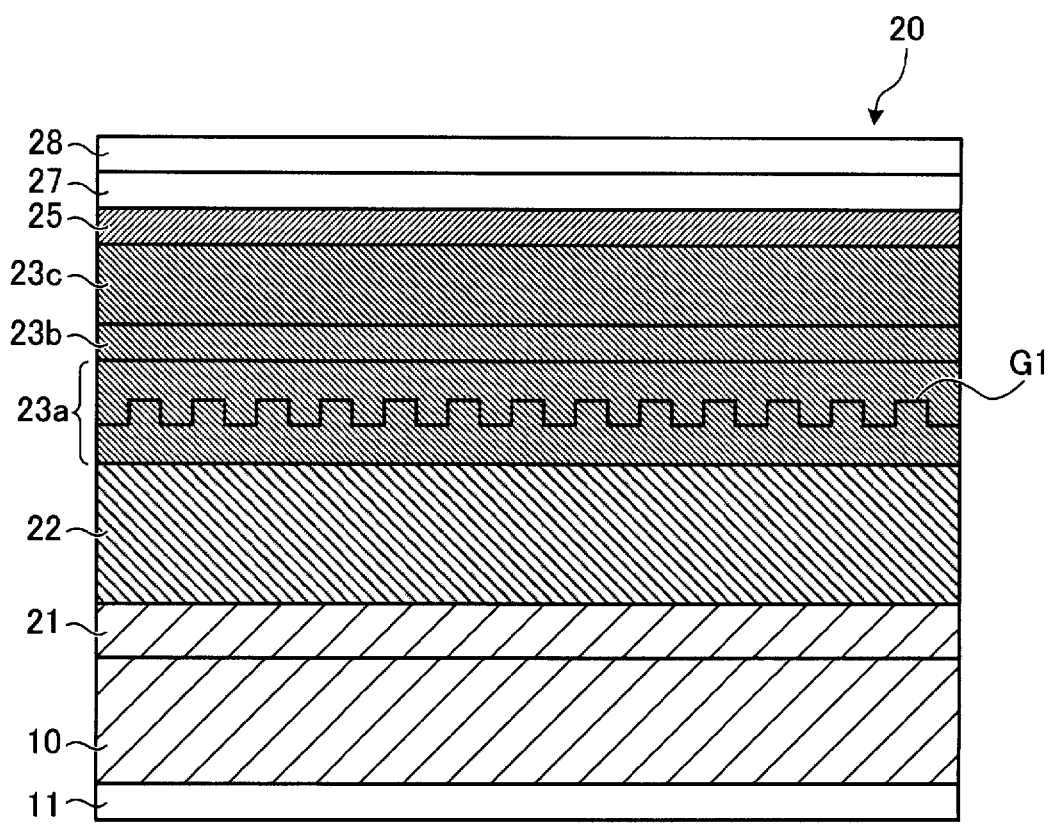
FIG. 3 is a section view of an active section of the semiconductor laser shown in FIG. 1 taken along an optical waveguide direction of a semiconductor active layer.

Meanwhile, FIG. 3 is a section view of the active section 20 of the semiconductor laser 100 shown in FIG. 1 taken along the optical waveguide direction of the semiconductor active layer 22. As shown in FIG. 3, a distributed-feedback diffraction grating G1 as a wavelength selecting means is formed in the upper cladding layer 23a of the active section 20 along the semiconductor active layer 22 and has the same structure with a normal distributed-feedback (DFB) laser. It is noted that a pitch of the diffraction grating G1 is 240 nm and Bragg wavelength is 1550 nm.

Figure 4:
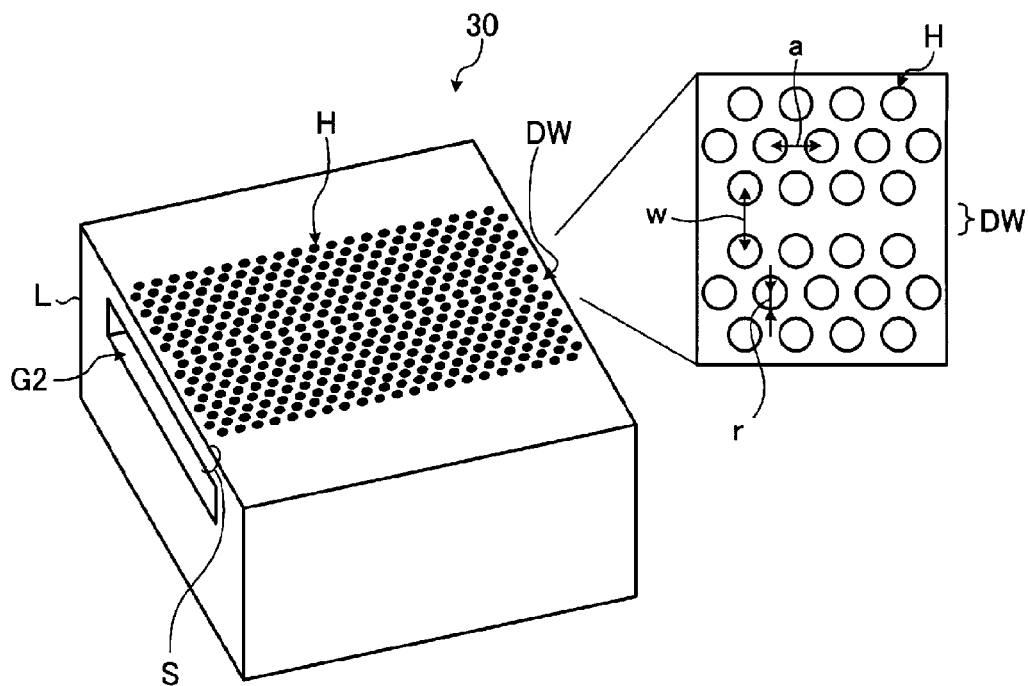
FIG. 4 is a schematic perspective view and an enlarged view of an upper surface of a photonic crystal optical waveguide shown in FIG. 1.

Next, the photonic crystal optical waveguide 30 will be explained. FIG. 4 is a schematic perspective view and an enlarged view of an upper surface of the photonic crystal optical waveguide 30 shown in FIG. 1. As shown in FIG. 4, the photonic crystal optical waveguide 30 has a structure in which a slab structure S is formed on an air gap G2 that penetrates through side surfaces of a semiconductor laminate L. Holes H formed so as to vertically penetrate through this slab structure in the semiconductor laminate direction are arranged into a shape of triangular lattice except of part where a waveguide is formed. As a result, the holes H form two-dimensional photonic crystal, i.e., a periodic structure of two-dimensional refractive index, within a plane perpendicular to the semiconductor laminate direction. Then, this two-dimensional photonic crystal forms a line defect waveguide section DW that is to guide light, thus composing the photonic crystal optical waveguide 30. It is noted that a lattice constant of the triangular lattice formed by the holes H is a. A width W of the line defect waveguide section DW is represented by a distance between centers of the holes H interposing the line defect waveguide section DW.

Note that with respect to the lattice constant a of the triangular lattice formed by the holes H, W is 1.08a and a diameter r of the hole H is 0.29a. If a=775 nm for example, W is 837 nm and r is 224.75 nm. Still more, a length L3 of the photonic crystal optical waveguide 30 is 100 μm.

Figure 5:
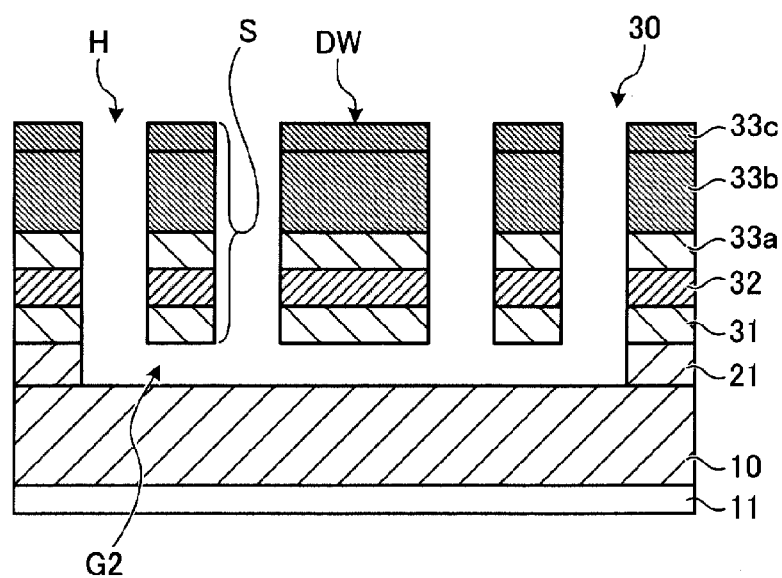
FIG. 5 is a section view of the photonic crystal optical waveguide shown in FIG. 1 taken along a line B-B.

FIG. 5 is a section view of the photonic crystal optical waveguide 30 shown in FIG. 1 taken along a line B-B thereof. It is noted that FIG. 5 shows the section view of the photonic crystal optical waveguide 30 by omitting a number of holes H. As shown in FIG. 5, the photonic crystal optical waveguide 30 has a structure in which the common lower cladding layer 21, a lower cladding layer 31, a semiconductor core layer 32, and upper cladding layers 33a through 33c are layered on the common substrate 10 having the n-side electrode 11 formed on the back thereof. The air gap G2 is formed in part of the lower cladding layer 21, the slab structure S is structured from the lower cladding layer 31 to the upper cladding layer 33c and the holes H are formed so as to penetrate also from the lower cladding layer 31 to the upper cladding layer 33c. It is noted that the semiconductor core layer 32 is made of intrinsic GaInAsP of 500 nm thick, the lower cladding layer 31 and the upper cladding layers 33a through 33c are made of intrinsic InP, thus forming the three-layered slab structure. Still more, air cladding is formed by air on the outside of the upper cladding layer 33c and air within the air gap G2.

Figure 6:
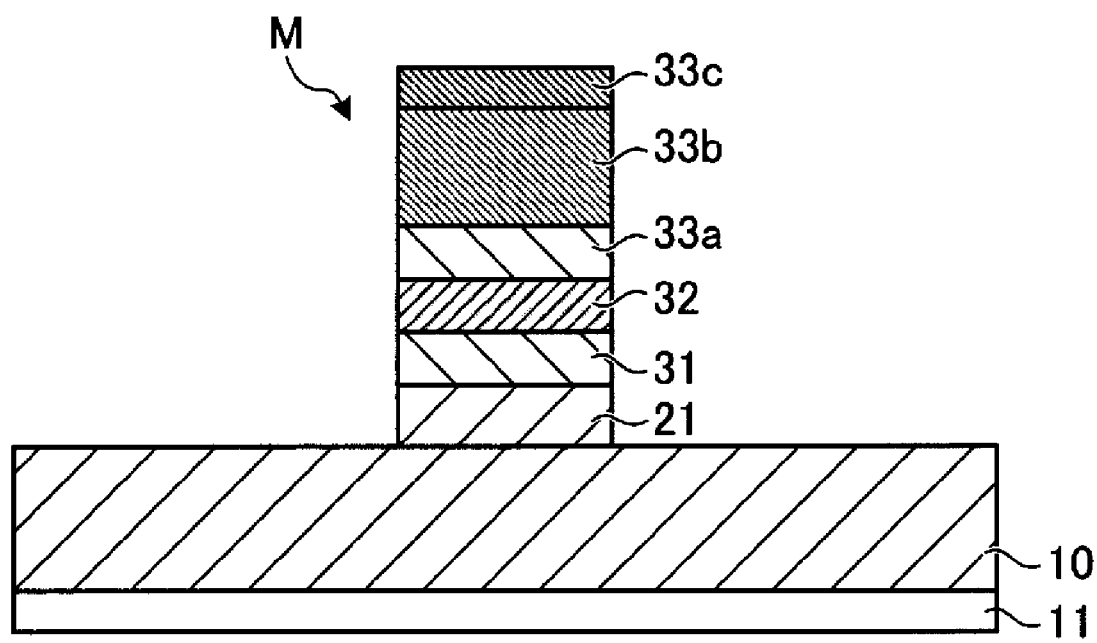
FIG. 6 is a section view of a waveguide mode converter shown in FIG. 1 taken along a line C-C.

Next, the waveguide mode converter 40 will be explained. As shown in FIG. 1, the waveguide mode converter 40 has 500 μm of length L4, 2.0 μm of width W3 on the side of the active section 20, 0.8 μm of width W4 on the side of the photonic crystal optical waveguide 30 and is tapered so that its width gradually reduces down from the side of the active section 20 to the side of the photonic crystal optical waveguide 30. FIG. 6 is a section view of the waveguide mode converter 40 shown in FIG. 1 taken along a line C-C in the figure. As shown in FIG. 6, the waveguide mode converter 40 has a structure in which the common lower cladding layer 21, the common lower cladding layer 31, the semiconductor core layer 32 and the upper cladding layers 33a through 33c are layered on the common substrate 10 having the n-side electrode 11 formed on the back thereof. The waveguide mode converter 40 has a high-mesa structure M formed into a shape of mesa-stripe from the upper cladding layer 33c to the depth reaching to the lower cladding layer 21 while interposing the semiconductor core layer 32.

It is noted that while a coupling loss of the semiconductor active layer 22 of the active section 20 and the photonic crystal optical waveguide 30 is around 7 dB when they are directly coupled, it is preferable to insert the waveguide mode converter 40 because the coupling loss is reduced to 1 dB or less.

Still more, the semiconductor laser 100 has a length L5 of about 1000 μm that is about the same with conventional ones.

This semiconductor laser 100 operates as follows. At first, voltage is applied between the n-side electrode 11 and the p-side electrode 27 to inject electric current to the semiconductor active layer 22 and to generate fluorescence. Then, the generated fluorescence is guided in the waveguide mode converter 40 and the photonic crystal optical waveguide 30 and the optical cavity 50 oscillates this guided light as laser. At this time, the diffraction grating G1 selectively oscillates light of wavelength corresponding to a longitudinal mode near 1550 nm, i.e., its Bragg reflection wavelength, as the laser as a wavelength selecting means. As a result, a laser beam of a continuous wave (CW) having the wavelength selected by the diffraction grating G1 is outputted out of one end of the optical cavity 50.

Here, the semiconductor laser 100 has the structure in which the photonic crystal optical waveguide 30 is inserted into the optical cavity 50 in order to reduce the line-width of the laser beam to be oscillated. Then, due to the low group velocity effect of the photonic crystal optical waveguide 30, the semiconductor laser 100 has a very high Q factor even though it is small and reduces the line-width of the laser beam to be output.

Figure 7:
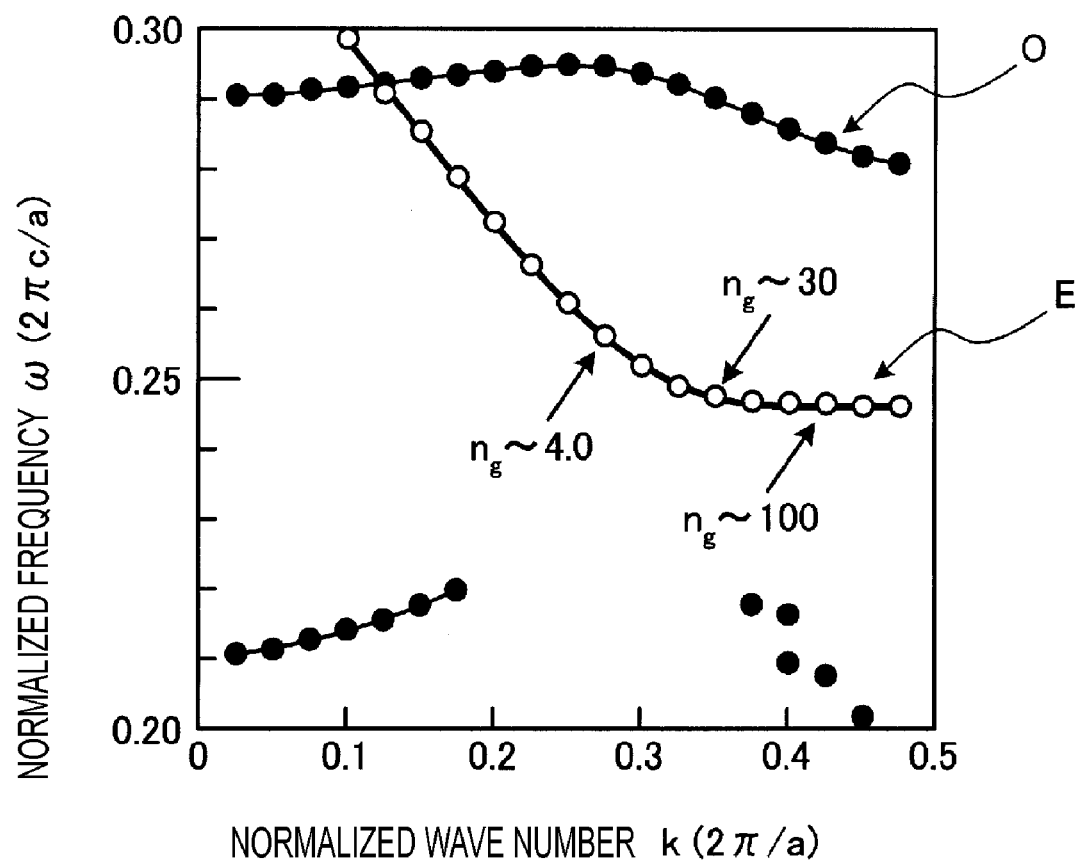
FIG. 7 is a chart showing dispersion curves of the photonic crystal optical waveguide shown in FIG. 1.
Figure 8:
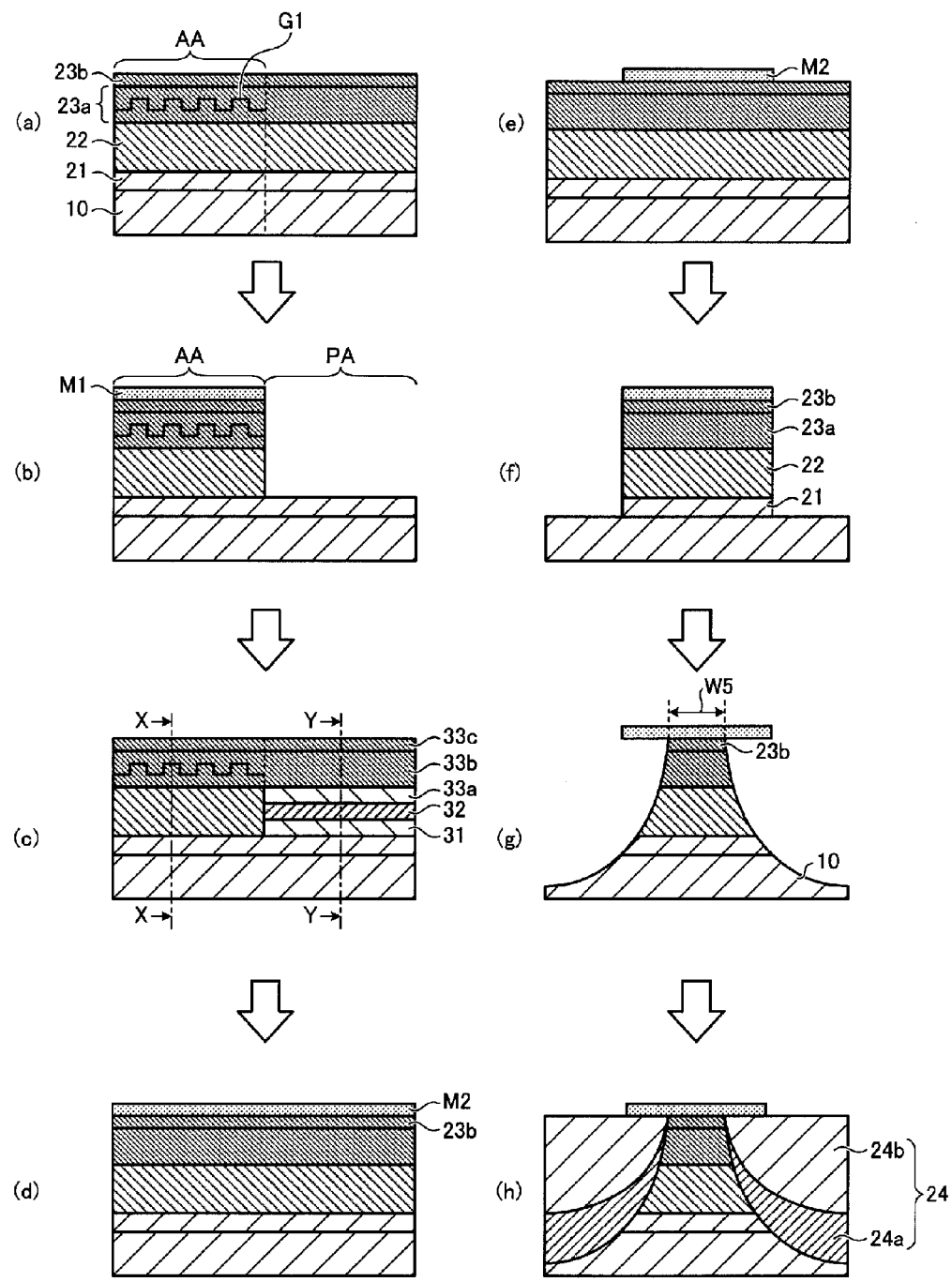
FIGS. 8A through 8H are drawings for explaining one exemplary method for fabricating the semiconductor laser shown in FIG. 1.
Figure 9:
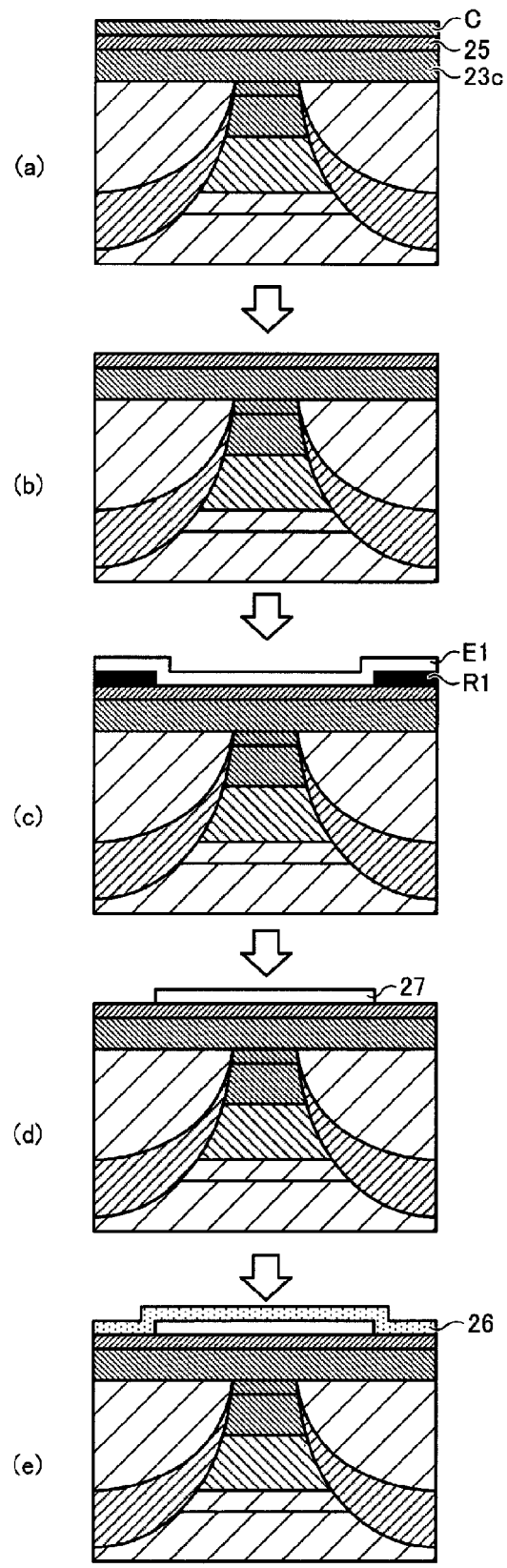
FIGS. 9A through 9E are drawings for explaining one exemplary method for fabricating the semiconductor laser shown in FIG. 1.
Figure 10:
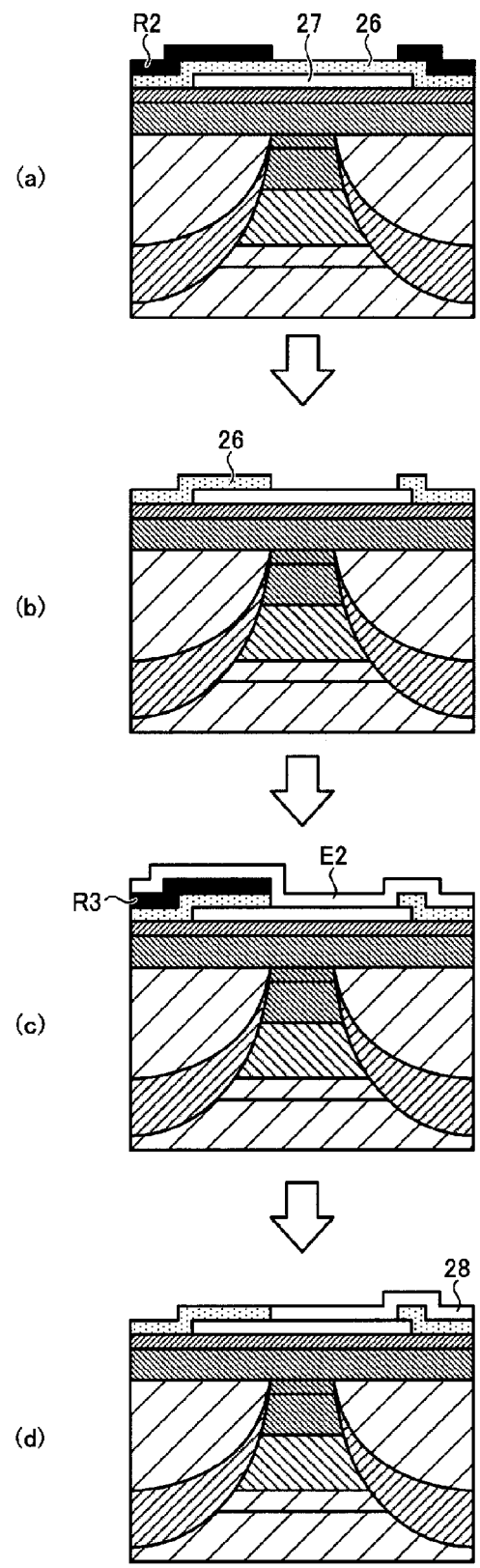
FIGS. 10A through 10D are drawings for explaining one exemplary method for fabricating the semiconductor laser shown in FIG. 1.
Figure 11:
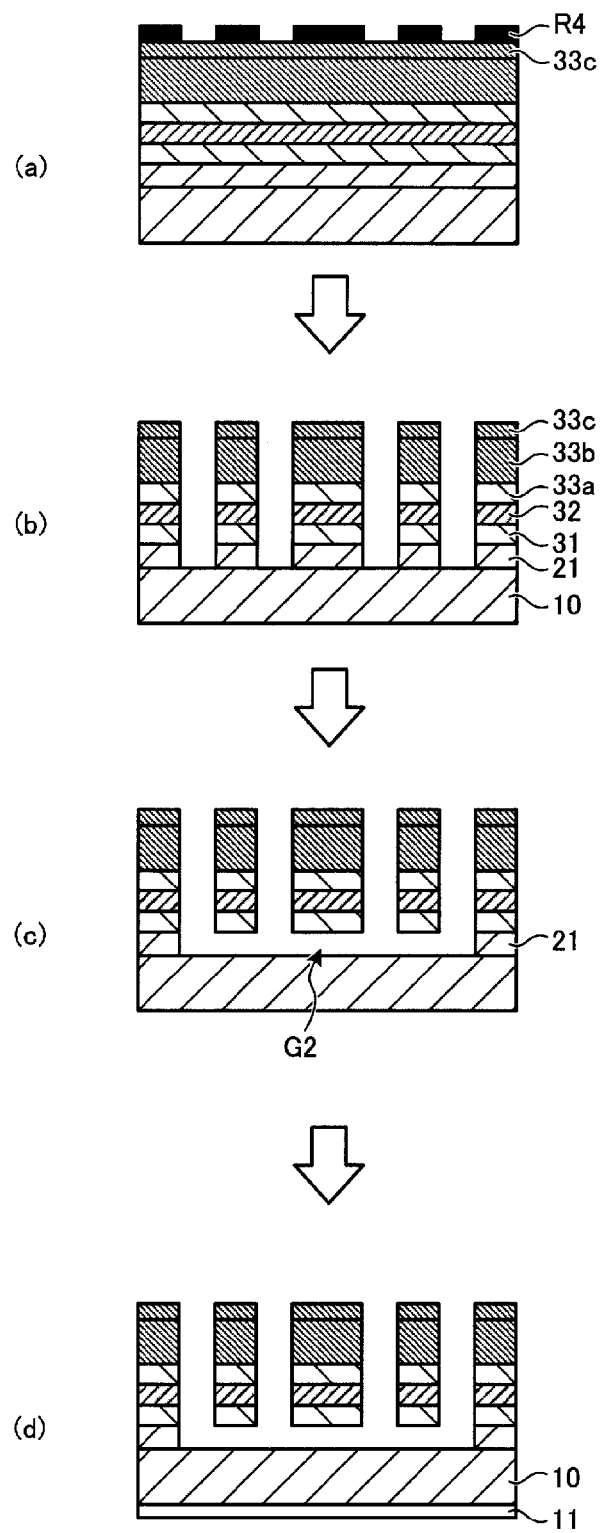
FIGS. 11A through 11D are drawings for explaining one exemplary method for fabricating the semiconductor laser shown in FIG. 1.

This point will be explained concretely below. FIG. 7 is a chart showing dispersion curves of the photonic crystal optical waveguide 30 shown in FIG. 1 (see Non-patent Document 2). Note that in FIG. 7, an axis of abscissas indicates normalized wave-number and an axis of ordinate indicates normalized frequency. As shown in FIG. 7, one each even mode E and odd mode O are formed within a photonic band gap by introducing the line defect waveguide section DW in the photonic crystal optical waveguide 30. Among them, the even mode E having a strong electromagnetic field in the center of the waveguide is advantageous in terms of coupling with the outside, so that the even mode E is utilized here. It is noted that because the semiconductor cladding is utilized and the refractive index of the cladding is large in the photonic crystal optical waveguide 30, an inclination of a light line of the cladding becomes large and the waveguide mode is leaky in the whole range drawn in FIG. 7.

As shown in FIG. 7, group refractive index $n_g$ immensely increases and a value around 100 may be anticipated as the normalized wave-number approaches to 0.5 in the photonic crystal optical waveguide 30. For instance, if the wavelength is 1.55 μm, a value more than 100 can be obtained as the group refractive index $n_g$. Accordingly, it is possible to improve the Q factor of the optical cavity 50 and to reduce the spectral line-width of the laser beam by inserting the photonic crystal optical waveguide 30 having the abovementioned characteristics into the optical cavity 50.

Still more, because the length L5 of the semiconductor laser 100 is about 1000 μm that is almost equal to that of the conventional laser as described above, it is possible to realize stable characteristics even though it is small and its cost is low.

Here, what is important to oscillate a desirable laser beam is to coincide the Bragg wavelength of the diffraction grating G1 with wavelength of either one of the longitudinal modes of the optical cavity 50. The wavelength λ of the longitudinal mode of the optical cavity 50 may be represented by Equation 4, as follows:

$$\lambda = \frac{2(n_{laser}l_{laser} + n_{taper}l_{taper} + n_{pc\_waveguide}l_{pc\_waveguide})}{q} \quad (4)$$

It is noted that in Equation 4, $n_{laser}$, $n_{taper}$ and $n_{pc\_waveguide}$ indicate group refractive index of the optical waveguides in the active section 20, the waveguide mode converter 40 and the photonic crystal optical waveguide 30, respectively. Still more, $l_{laser}$, $l_{taper}$ and $l_{pc\_waveguide}$ indicate lengths of the optical waveguides in the active section 20, the waveguide mode converter 40 and the photonic crystal optical waveguide 30, respectively. Further, q is an integer.

In the case of the first embodiment, $n_{laser}$=3.2, $n_{taper}$=3.2 and $n_{pc\_waveguide}$=100, $l_{laser}$=400 μm, $l_{taper}$=500 μm and $l_{pc\_waveguide}$=100 μm for example. In this case, while the wavelength λ in Equation 4 is 25760 μm when q=1 for example, the wavelength λ of the longitudinal mode of the optical cavity 50 becomes 1549.94 nm that is substantially equal with the Bragg wavelength of the diffraction grating G1 when q=16620 and the semiconductor laser oscillates the laser substantially with this wavelength. It is noted that the oscillation wavelength is finely adjusted by controlling temperature and electric current of the active section 20 so that the Bragg wavelength accurately coincides with the wavelength λ of the longitudinal mode of the optical cavity 50.

Note that conventionally, a CPM-DFB laser is disclosed as a laser that realizes a narrow spectral line-width as described in Non-patent Document 3 for example. This CPM-DFB laser realizes a laser beam having a spectral line-width of 170 kHz with 1.2 mm of cavity length. Meanwhile, the semiconductor laser 100 of the first embodiment is considered to be able to increase the Q factor as high as 3.35 times if it can realizes the waveguide loss equal to that of the CPM-DFB laser. In this case, it is possible to reduce the spectral line-width by 11.5 times from Equation 1. That is, the semiconductor laser 100 of the first embodiment is anticipated to be able to realize a laser beam of 15.1 kHz whose spectral line-width is narrower than the conventional ones by more than single digit. This spectral line-width is a fully narrow spectral line-width to use as a source of signal light of 16 QAM and 64 QAM coherent communications whose number of multiple values is higher than that of 16 QAM.

Because the semiconductor laser of the first embodiment has the structure in which the semiconductor active layer 22 is separated from the photonic crystal structure made by the holes H and the surface of the semiconductor active layer 22 does not expose to the inside of the holes H, it is possible to prevent a laser output from dropping due to surface recombination and to keep reliability.

It is noted that although the semiconductor active layer 22 has the buried mesa structure in which the semiconductor active layer 22 is buried by the current blocking layers 24 in the semiconductor laser 100 of the first embodiment, the semiconductor active layer may have a high-mesa structure in which the surface of the semiconductor active layer is passivated by an InP film and others.

(Fabrication Method)

Next, methods for fabricating the semiconductor laser 100 of the first embodiment will be explained. FIGS. 8 through 11 are drawings for explaining exemplary methods for fabricating the semiconductor laser 100 shown in FIG. 1.

At first, a MOCVD (Metal Organic Chemical Vapor Deposition) crystal growing apparatus is used to grow crystals at 600° C. of growth temperature as follows. That is, the lower cladding layer 21, the semiconductor active layer 22 and the upper cladding layers 23a and 23b containing the diffraction grating G1 are formed on the substrate 10 as shown in FIG. 8A. Note that the upper cladding layer 23a containing the diffraction grating G1 is formed as follows. That is, after growing a p-type InP layer on the semiconductor active layer 22, a resist mask is patterned by means of EB (Electron Beam) writing and the diffraction grating G1 is formed by means of dry etching. After that, the p-type InP layer is grown again to form the upper cladding layer 23a. It is noted that although the diffraction grating G1 is formed in an active area AA where the active section 20 is to be formed, it may be formed also in another area.

Next, a mask M1 made of a SiN film is formed only on the upper cladding layer 23b of the active area AA as shown in FIG. 8b. Then, the upper cladding layers 23a and 23b and the semiconductor active layer 22 of the passive area PA where the passive waveguides such as the waveguide mode converter 40, the photonic crystal optical waveguide 30 and others are to be formed are removed by means of dry etching using chlorine or methane hydrogen gas. Then, the lower cladding layer 31, the semiconductor core layer 32 and the upper cladding layers 33a through 33c are formed at the removed part by means of a butt joint growing method as shown in FIG. 8c. The active section 20 containing the semiconductor active layer 22, the waveguide mode converter 40 and the photonic crystal optical waveguide 30 may be readily formed and monolithically integrated on the same substrate by using the butt joint growing method.

Next, steps for fabricating the active section 20 will be explained by making reference to a cross-section thereof taken along a line X-X in FIG. 8c. At first, a mask M2 made of a SiN film formed by means of PCVD (Plasma Chemical Vapor Deposition) method is formed on the whole surface of the upper cladding layer 23b of the active area AA as shown in FIG. 8d and then the mask M2 is etched into a stripe shape extending in a depth direction of the figure around an area where the mesa structure is to be formed as shown in FIG. 8e. After that, the upper cladding layers 23a and 23b, the semiconductor active layer 22 and the lower cladding layer 21 in the areas other than that of the mask M2 are removed by means of dry etching of ICP-RIE (Inductive Coupling Plasma-Reactive Ion Etcher using methane hydrogen gas using the mask M2 as a mask as shown in FIG. 8f. In succession, the layers from the substrate 10 to the upper cladding layer 23b are etched by using wet etching to form the mesa structure as shown in FIG. 8g. At this time, the mesa structure is formed such that a width W5 of the upper cladding layer 23b is around 1.6 μm. Next, the current blocking layer 24 is formed by sequentially forming the lower and upper current blocking layers 24a and 24b to bury the mesa structure as shown in FIG. 8h. After that, the mask M2 is removed by BHF (buffered hydrofluoric acid).

Next, the upper cladding layer 23c, the contact layer 25 and a cap layer C, i.e., a protective layer, are formed as shown in FIG. 9a and then the cap layer C is removed as shown in FIG. 9b. Next, a resist R1 whose part corresponding to the p-side electrode 27 is patterned is formed by means of photolithography and an AuZn film E1 is evaporated thereon as shown in FIG. 9c. Next, the resist R1 is removed to lift off the film E1 and to form the p-side electrode 27 as shown in FIG. 9d. After that, a protective layer 26 made of a SiN film is formed as shown in FIG. 9e.

Next, a resist R2 whose part is patterned to contact the electrode pad 28 with the p-side electrode 27 is formed on the protective layer 26 by means of photolithography as shown in FIG. 10a, the protective layer 26 at the part where the resist R2 is patterned is etched by means of RIE using $CF_4$ gas and then the resist R2 is removed as shown in FIG. 10b. Further, a resist R3 whose part corresponding to the electrode pad 28 is patterned is formed on the protective layer 26 by means of photolithography and a Ti/Pt film E2 is evaporated thereon as shown in FIG. 10c. After that, the resist R3 is removed to lift off the film E2 and to form the electrode pad 28 as shown in FIG. 10d.

Next, steps for fabricating the waveguide mode converter 40 and the photonic crystal optical waveguide 30 will be explained with reference to a cross-section thereof taken along a line Y-Y in FIG. 8c. At first, a resist R4 is formed on the upper cladding layer 33c in the passive area PA and is patterned into the shape of the waveguide mode converter 40 and the photonic crystal optical waveguide 30 by means of EB writing as shown in FIG. 11a. Then, using the patterned resist R4 as a mask, vertical anisotropic etching is carried out from the upper cladding layer 33c to the depth of the substrate 10 through the semiconductor core layer 32 to form the waveguide mode converter 40 and the photonic crystal optical waveguide 30 by means of ICP-RIE using methane hydrogen gas as shown in FIG. 11b. After that, the lower cladding layer 21 at the predetermined part of the photonic crystal optical waveguide 30 is etched by means of selective wet etching to form the air gap G2 as shown in FIG. 11c.

Finally, the whole surface of the back of the substrate 10 including the active area AA and the passive area PA is polished to evaporate an AuGeNi/Au film on the polished back surface and to form the n-side electrode 11 as shown in FIG. 11d. After that, sintering is carried out at 430° C. to realize an ohmic contact state. Then, end faces are formed by means of cleavage and HR (High Reflection) coating is applied to these end faces so that their reflectance becomes 99% or more to form the high reflectance reflective coatings 51 and 52. Then, the device is separated, thus completing the semiconductor laser 100.

As described above, the semiconductor laser 100 of the first embodiment can oscillate the laser beam having an extremely narrow spectral line-width, is small, is low cost and has the stable characteristics.

Second Embodiment

Figure 12:
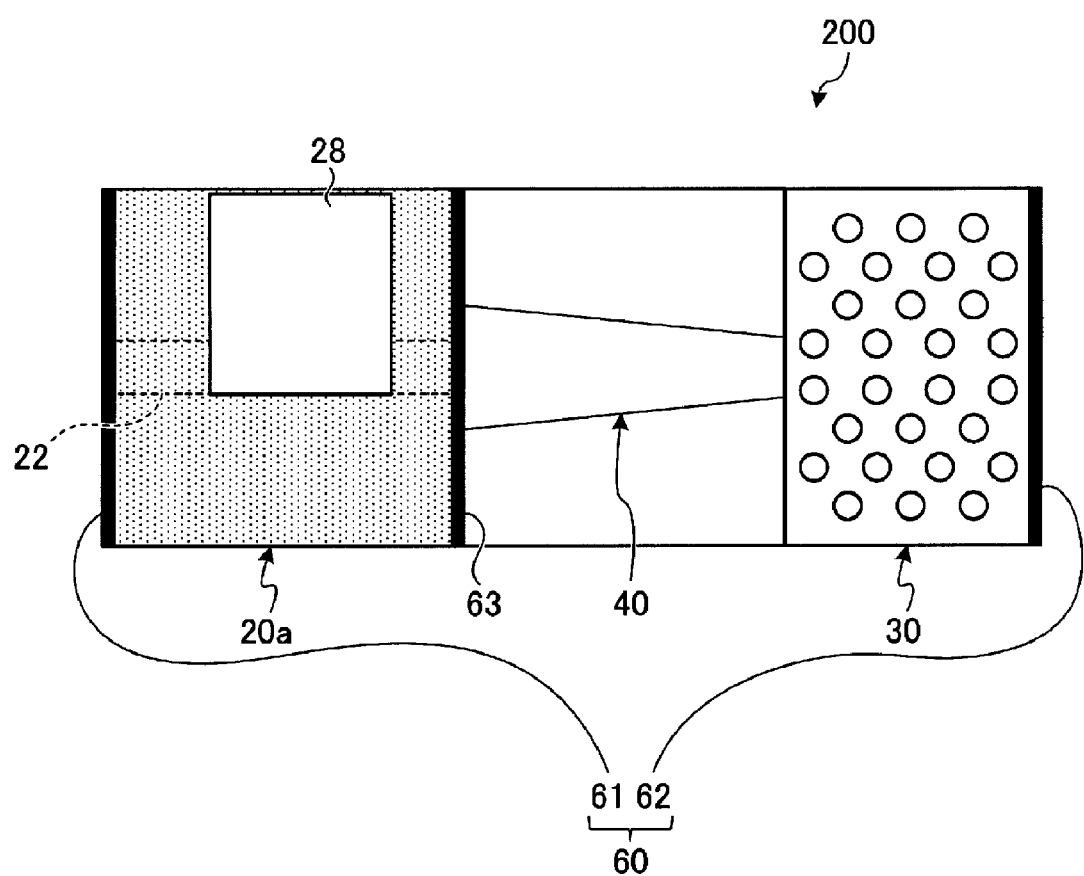
FIG. 12 is a schematic plan view of a semiconductor laser according to a second embodiment of the invention.

Next, a second embodiment of the invention will be explained. FIG. 12 is a schematic plan view of a semiconductor laser according to the second embodiment of the invention. The semiconductor laser 200 of the second embodiment has a structure in which the active section 20 is replaced with an active section 20a and the optical cavity 50 is replaced with an optical cavity 60 in the semiconductor laser 100 of the first embodiment.

The active section 20a has a structure in which the diffraction grating G1, i.e., the wavelength selecting means, is eliminated from the active section 20 of the first embodiment. The optical cavity 60 is a Fabry-Perot optical cavity having a high reflection coating 62 formed on the end face of the photonic crystal optical waveguide 30 and a DBR (Distributed Bragg Reflector) coating 61 formed on the end face of the active section 20a. A DBR mirror 63 is formed also another end face of the active section 20a. That is, an internal optical cavity composed of the pair of DBR mirrors 61 and 63 disposed so as to interpose the semiconductor active layer 22 in the waveguide direction of the active section 20a functions as the wavelength selecting means in the semiconductor laser 200. It is noted that the reference numeral 28 denotes the electrode pad.

This semiconductor laser 200 can also oscillate a very narrow spectral line-width laser beam, is small, is low cost and has stable characteristics similarly to the semiconductor laser 100 of the first embodiment.

It is noted that it is important to coincide the Bragg's wavelength of the DBR mirrors 61 and 63 with the wavelength of the longitudinal mode of the optical cavity 60 by using Equation 4 described above similarly to the semiconductor laser 100 of the first embodiment.

Still more, the semiconductor laser 200 may be fabricated by eliminating the steps for forming the diffraction grating G1 and by forming the DBR mirror 63 on the side of the active area AA after the dry etching process of the passive area PA shown in FIG. 8B in the method for fabricating the semiconductor laser 100 described above for example.

Third Embodiment

Figure 13:
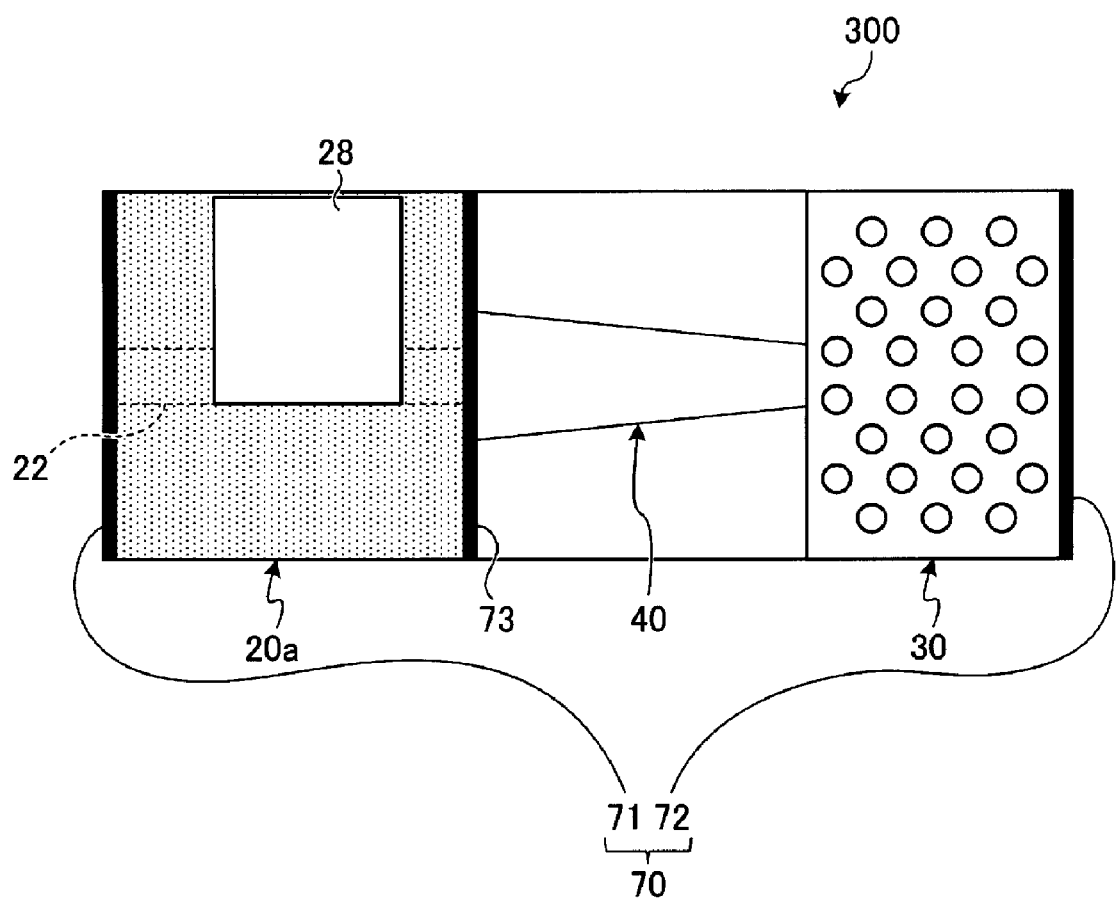
FIG. 13 is a schematic plan view of a semiconductor laser according to a third embodiment of the invention.

Next, a third embodiment of the invention will be explained. FIG. 13 is a schematic plan view of a semiconductor laser according to the third embodiment of the invention. As shown in FIG. 13, the semiconductor laser 300 has a structure in which the high reflection coating 62 is replaced with a high reflection coating 72 and the DBR mirrors 61 and 63 are replaced with high reflection coatings 71 and 73 similar to the high reflection coating 72 in the semiconductor laser 200 of the second embodiment. The high reflection coatings 71 and 72 compose an optical cavity 70. Then, an internal optical cavity composed of the pair of high reflection coatings 71 and 73 disposed so as to interpose the semiconductor active layer 22 in the waveguide direction of the active section 20a functions as the wavelength selecting means in the semiconductor laser 300. As a result, this semiconductor laser 300 can also oscillate a very narrow spectral line-width laser beam, is small, is low cost and has stable characteristics similarly to the semiconductor laser 100 of the first embodiment. It is noted that it is important to coincide the longitudinal wavelength of the high reflection coatings 71 and 73 with the wavelength of the longitudinal mode of the optical cavity 70 by using Equation 4 described above.

Fourth Embodiment

Next, a fourth embodiment of the invention will be explained. While the semiconductor lasers 100 through 300 of the first through third embodiments described above output a CW laser beam, a semiconductor laser of the fourth embodiment has a mode locking means and outputs a pulsed laser beam.

Figure 14:
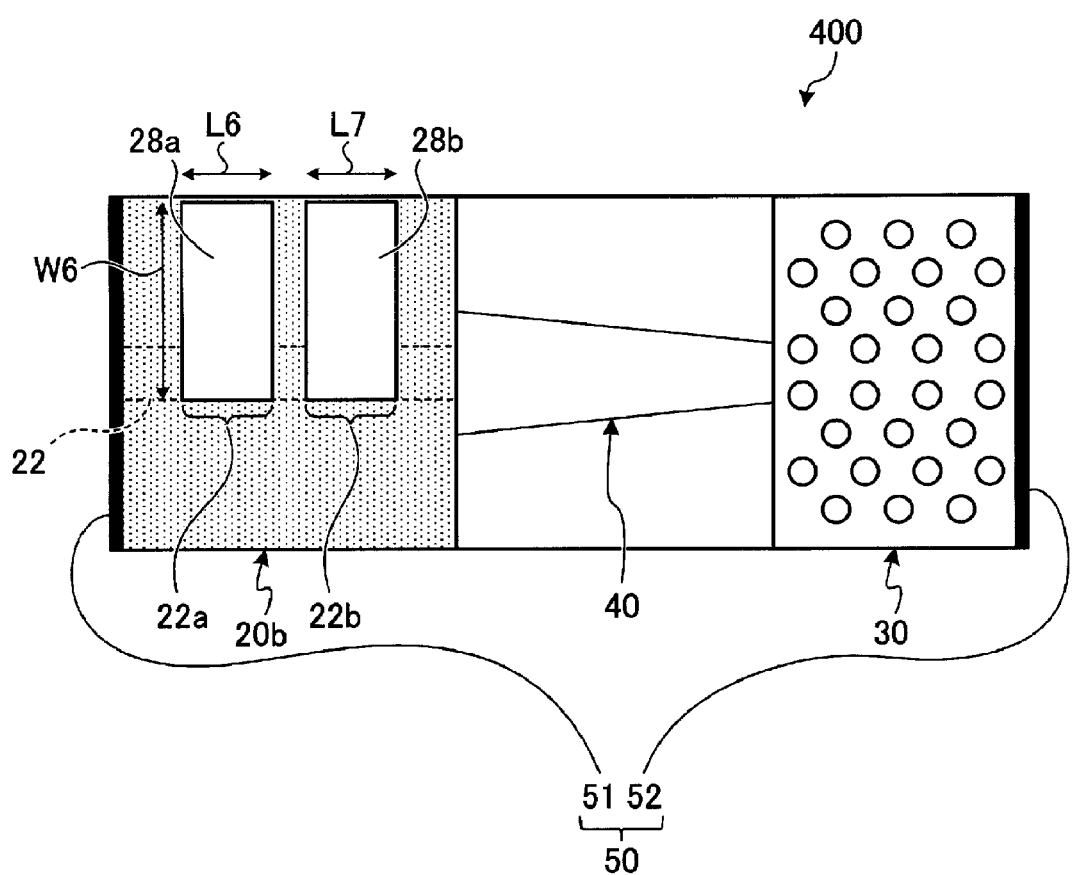
FIG. 14 is a schematic plan view of a semiconductor laser according to a fourth embodiment of the invention.

FIG. 14 is a schematic plan view of the semiconductor laser of the fourth embodiment. The semiconductor laser 400 of the fourth embodiment has a structure in which the active section 20 is replaced with an active section 20b in the semiconductor laser 100 of the first embodiment.

The active section 20b has a structure in which the diffraction grating G1, i.e., the wavelength selecting means, is eliminated and the electrode pad 28 is replaced with electrode pads 28a and 28b in the active section 20 of the first embodiment. The electrode pads 28a and 28b has 200 μm of width W6 and 100 μm of lengths L6 and L7, respectively.

In this semiconductor laser 400, the active section 20b has a structure of applying forward bias voltage to the semiconductor active layer 22 by utilizing the electrode pad 28a and the semiconductor active layer 22 becomes an optical amplifying area 22a in this forward bias applied area. The active section 20b also has a structure of applying inverse bias voltage to the semiconductor active layer 22 by utilizing the electrode pad 28b. When the inverse bias voltage is applied to the semiconductor active layer 22, the semiconductor active layer 22 becomes a saturable absorber. Accordingly, the semiconductor active layer 22 becomes a saturable absorbing area 22b in the inverse bias applied area. The optical amplifying area 22a is structurally insulated from the saturable absorbing area 22b.

As a result, if electric current is injected to the optical amplifying area 22a and the inverse bias voltage is applied to the saturable absorbing area 22b, the semiconductor laser 400 generates the pulsed laser beam with repetitive frequency $f_{rep}$ given by the following Equation 5 by a passive mode synchronizing action of the saturable absorbing area 22b:

$$f_{rep} = \frac{qc}{2(n_{laser}l_{laser} + n_{taper}l_{taper} + n_{pc\_waveguide}l_{pc\_waveguide})} \quad (5)$$

It is noted that each variable in Equation 5 is the same with those in equation 4 described above. For example, if $n_{laser}=3.2$, $n_{taper}=3.2$, $n_{pc\_waveguide}=100$, $l_{laser}=400$ μm, $l_{taper}=500$ μm and $l_{pc\_waveguide}=100$ μm, basic oscillation frequency, i.e., q=1, is 23.3 GHz and the semiconductor laser 400 oscillates with integer times of this basic oscillation frequency.

Spectrum of such pulsed laser beam contains a plurality of longitudinal modes of ten for example. It is anticipated to be able to realize 15.1 kHz as a line-width of each longitudinal mode in the same manner with the case of the first embodiment and is narrower by about one digit than that of the conventional mode synchronizing laser whose cavity length is around 1.2 mm for example. It is noted that such narrow spectral line-width mode locked laser as the semiconductor laser 400 may be used as a local oscillator on the receiver side of WDM-QAM (see Non-patent document 4).

Still more, it is still preferable to apply forced mode locking by superimposing a RF signal of repetitive frequency corresponding to Equation 5 to the inverse bias voltage of DC to be applied to the saturable absorbing area 22b in the semiconductor laser 400 because timing jitter of the pulse may be reduced as compared to the case of the passive mode locking.

It is noted that although the semiconductor active layer has the MQW structure in the semiconductor lasers of the respective embodiments, a number of well layers, a thickness of the layer and others of the MQW structure may be appropriately set. Still more, the semiconductor active layer may have a bulk structure. Further, the spectral line-width of the laser beam may be reduced by eliminating the waveguide mode converter and by directly connecting the active section with the photonic crystal optical waveguide.

Still more, although the materials and sizes and others such as the compound semiconductor, electrode and others are set for the wavelength of 1.55 μm in the semiconductor lasers of the respective embodiments, materials, sizes and others may be appropriately set corresponding to a wavelength and others of a laser beam to be oscillated and are not specifically limited.

| DESCRIPTION OF REFERENCE NUMERALS | |
|---|---|
| 10 | Substrate |
| 11 | n-side Electrode |
| 20, 20a, 20b | Active Section |
| 21, 31 | Lower Cladding Layer |
| 22 | Semiconductor Active Layer |
| 22a | Optical Amplifying Area |
| 22b | Saturable Absorption Area |
| 23a through 23c, 33a through 33c | Upper Cladding Layer |
| 24 | Current Blocking Layer |
| 24a | Lower Current Blocking Layer |
| 24b | Upper Current Blocking Layer |
| 25 | Contact Layer |
| 26 | Protective Layer |
| 27 | p-side Electrode |
| 28, 28a, 28b | Electrode Pad |
| 30 | Photonic Crystal Optical Waveguide |
| 32 | Semiconductor core Layer |
| 40 | Waveguide mode Converter |
| 50 through 70 | Optical Cavity |
| 51, 52, 62, 71 through 73 | High Reflection Coating |
| 61, 63 | DBR mirror |
| 100 through 400 | Semiconductor Laser |
| AA | Active Area |
| C | Cap Layer |
| DW | Line Defect Waveguide |
| E | Even Mode |
| E1 | AuZn Film |
| E2 | Ti/Pt Film |
| G1 | Diffraction Grating |
| G2 | Air Gap |
| H | Hole |
| L | Laminate |
| L1 through L7 | Length |
| M | High Mesa Structure |
| M1, M2 | Mask |
| O | Odd Mode |
| PA | Passive Area |
| R1 through R4 | Resist |
| S | Slab Structure |
| W1 through W6 | Width |

What is claimed is:

1. A semiconductor laser, comprising:
   a semiconductor active layer;
   a photonic crystal optical waveguide forming a periodic structure of two-dimensional refractive index within a plane perpendicular to a semiconductor laminate direction directly or indirectly connected to the semiconductor active layer;
   a waveguide mode converter inserted between the semiconductor active layer and the photonic crystal optical waveguide; and
   an optical cavity that:
      contains the semiconductor active layer, the waveguide mode convertor and the photonic crystal optical waveguide, and
      oscillates light that is generated from the semiconductor active layer and is guided through the waveguide mode convertor and the photonic crystal optical waveguide as laser light.

2. The semiconductor laser according to claim 1, wherein the waveguide mode convertor includes:
   an upper cladding layer and a lower cladding layer, and
   a core layer formed between the upper cladding layer and the lower cladding layer, and
   the waveguide mode converter has a high mesa structure formed into a shape of a mesa stripe from the upper cladding layer to a depth reaching at least to the lower cladding layer.

3. The semiconductor laser according to claim 1, further comprising a wavelength selecting means formed within the optical cavity and selectively oscillating light of wavelength corresponding at least to either one of longitudinal modes of the optical cavity as laser.

4. The semiconductor laser according to claim 3, wherein the wavelength selecting means is a distributed-feedback diffraction grating formed along the semiconductor active layer.

5. The semiconductor laser according to claim 3, wherein the wavelength selecting means is a pair of distributed Bragg reflecting mirrors disposed so as to interpose the semiconductor active layer in the optical waveguide direction.

6. The semiconductor laser according to claim 1, further comprising a mode locking means having a semiconductor saturable absorber.

7. The semiconductor laser according to claim 1, wherein the photonic crystal optical waveguide includes:
   an upper cladding layer and a lower cladding layer,
   a core layer formed between the upper cladding layer and the lower cladding layer,
   an air gap formed in part of the photonic crystal optical waveguide,
   a slab structure formed on the air gap, and
   a plurality of holes formed to penetrate through the slab structure in a semiconductor laminate direction, and
   the semiconductor active layer is separated from the photonic crystal structure via the waveguide mode convertor so that a surface of the semiconductor active layer is not exposed to an inside of the holes.

8. The semiconductor laser according to claim 7, wherein the holes are arranged in a shape of a triangular lattice in an area other than a part where a waveguide is formed.

* * * * *